United States Patent
Nintunze et al.

(10) Patent No.: US 7,570,080 B2
(45) Date of Patent: Aug. 4, 2009

(54) SET DOMINANT LATCH WITH SOFT ERROR RESILIENCY

(75) Inventors: Novat Nintunze, Portland, OR (US); Pham Giao, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/863,612

(22) Filed: Sep. 28, 2007

(65) Prior Publication Data

US 2009/0085601 A1 Apr. 2, 2009

(51) Int. Cl.
*H03K 19/096* (2006.01)
(52) U.S. Cl. .............................. 326/95; 326/121; 326/9; 326/98; 327/208; 327/218
(58) Field of Classification Search .............. 326/9–11, 326/81, 83, 93–98, 112, 119, 121; 327/144, 327/197–200, 208–212, 214, 215, 224, 225
See application file for complete search history.

(56) References Cited

U.S. PATENT DOCUMENTS

| | | | |
|---|---|---|---|
| 6,026,011 A | 2/2000 | Zhang | |
| 6,046,606 A * | 4/2000 | Chu et al. | 326/95 |
| 6,366,132 B1* | 4/2002 | Karnik et al. | 326/121 |
| 2004/0095825 A1* | 5/2004 | Tanizaki et al. | 365/207 |
| 2004/0246782 A1* | 12/2004 | Chu et al. | 365/189.05 |
| 2005/0231257 A1* | 10/2005 | Arima et al. | 327/208 |
| 2006/0001442 A1* | 1/2006 | Wood et al. | 326/9 |
| 2006/0026457 A1* | 2/2006 | Bernstein et al. | 714/6 |
| 2006/0082404 A1* | 4/2006 | Ishii et al. | 327/208 |
| 2008/0120525 A1* | 5/2008 | Agarwal | 714/731 |

* cited by examiner

*Primary Examiner*—James H. Cho
*Assistant Examiner*—Jany Tran
(74) *Attorney, Agent, or Firm*—Ked & Associates, LLP

(57) ABSTRACT

A logic circuit includes a storage node coupled to a data line and a soft-error protection circuit to change a logical value of the storage node from a first value to a second value when the logical value of the storage node does not correspond a logical value of an output node. The logic circuit may be a set dominant latch and a memory circuit may be formed based on the set dominant latch.

23 Claims, 4 Drawing Sheets

SET DOMINANT LATCH WITH SOFT ERROR RESILIENCY

FIELD

The present invention relates in at least some of its embodiments to electronic circuits.

BACKGROUND

With advances in integration of electronic devices, soft errors are becoming more prevalent. Soft errors include signal or data errors that result from no apparent defect in the design or construction of the host circuit. Rather, they are believed to be caused by environmental radiation. For example, soft errors may result when high-energy radiation energy particles originating in the atmosphere or package hit data storage nodes, to thereby cause the stored data to be modified. It may be possible to insulate circuits from soft errors using, for example, shields, error correction schemes, and array storage redundancy. However, those solutions have proven less than satisfactory and costly.

DETAILED DESCRIPTION

Electronic devices often include or have access to memory circuits for storing data. These circuits include caches, register files, read-only memories (ROMs), and random-access memories (RAMs) just to name a few. In order to manage the storage of data within these circuits, a variety of logic is typically used. Logic circuits are especially susceptible to soft errors, for example, because of their placement within or along signal paths coupled to relatively small storage locations in highly integrated arrays. While attempts have been made to protect some types of electronic circuits from soft errors, no attempts have been made to provide localized protection of set-dominant latches incorporated within memories or other storage devices from corruption due to soft errors.

Figure 1:
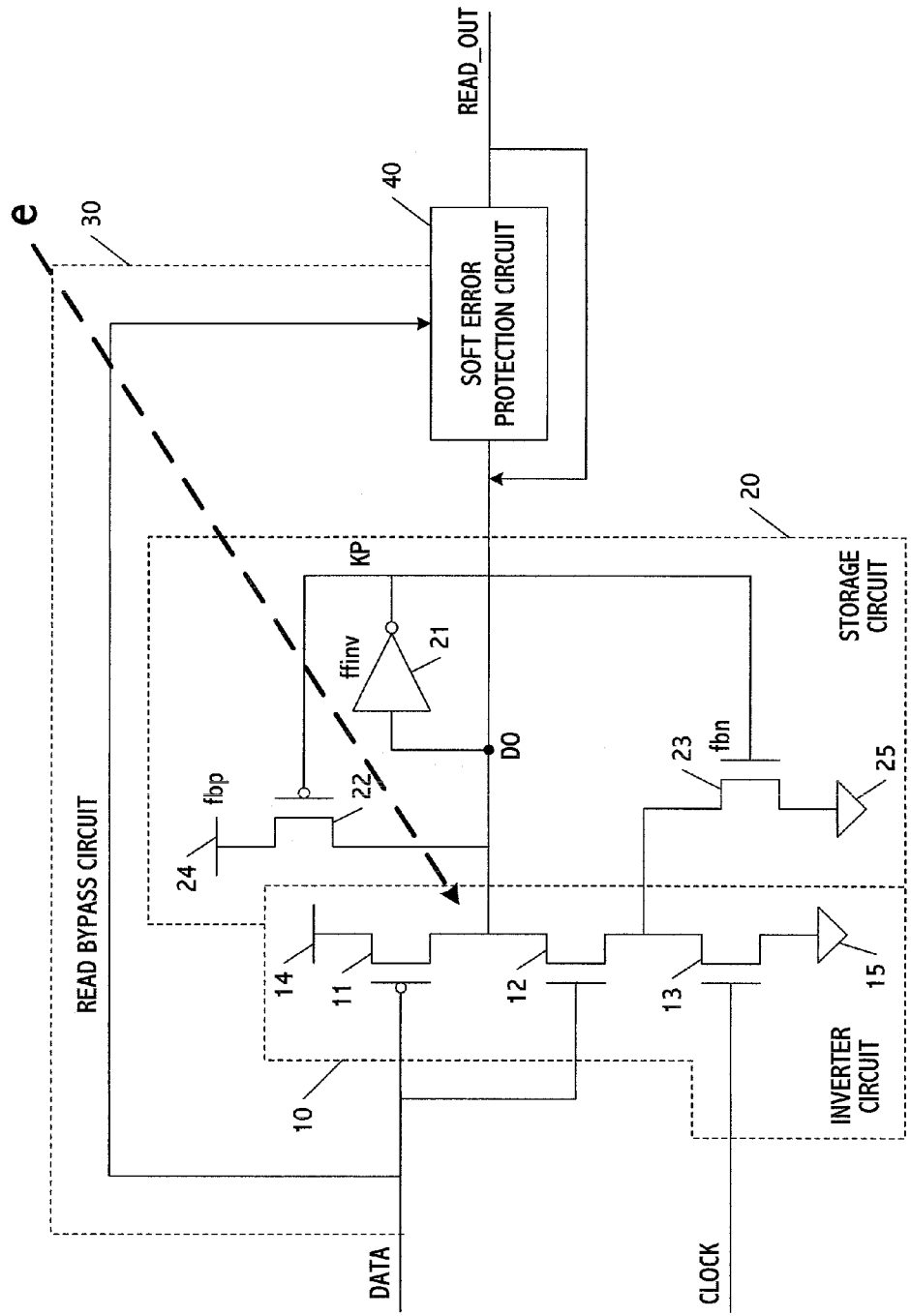
FIG. 1 is a diagram showing one embodiment of a latch equipped with a soft-error protection circuit in accordance with the present invention.

FIG. 1 shows a latch equipped with a soft-error protection circuit 40 in accordance with one embodiment of the present invention. While the latch is illustratively shown as an inverting set dominant latch (SDL), in alternative embodiments the soft-error protection circuit may be coupled to or incorporated within other types of latches, flip-flops, or logic circuits. Logic circuits of this type are typically found in the read path of memory circuits. If unprotected, high-energy radiation may change the logical values stored or otherwise propagating in the logic, which may, in turn, corrupt the data to be read.

The latch includes a first inverting circuit 10, that may or may not be a simple inverter, coupled to a first storage circuit 20 through a storage node D0. The first inverting circuit is formed from transistors 11 and 12 of opposite conductivities connected in series. The gates of these transistors are coupled to a data line (DATA), which, for example, may be a read global bit line coming out of a memory cell, and data is stored at a storage node coupled between the transistors. Additionally, the storage of data at the storage node is controlled by a clock signal (CLOCK) coupled to the gate of a transistor 13.

With this arrangement, the storage node is complementary to the data line. That is, the storage node assumes a first logical value when the data line assumes a second logical value (inverted value), and vice versa. Thus, when the data line assumes a logical zero value, transistor 11 is turned on to couple the storage node D0 to a voltage supply 14. As a result, the storage node assumes a logical one value. Transistor 12 is not turned on at this time as a result of the logical zero value of the data line.

When the data line assumes a logical one value, transistor 11 is turned off and transistor 12 is turned on. If the CLOCK signal is also a logical, causing transistor 13 to turn on, transistors 12 and 13 will couple the storage node D0 to a ground (or other reference) potential 15 that corresponds to a logical zero value.

The first storage circuit 20 stores the logical value at the storage node. The first storage circuit may be constructed in any one of a variety of ways. In accordance with one embodiment of the present embodiment, the storage circuit is formed from an inverter 21, a transistor 22, and a transistor 23, which collectively form a first keeper circuit. Inverter 21 inverts the logical value at the storage node to place transistors 22 and 23 in a state that will prevent the voltage, and thus the logical value, of the storage node from dissipating, especially between pulses applied by the clock signal to the gate of transistor 13. Transistors 22 and 23 have opposite conductivities, with transistor 22 coupled to a voltage source 24 corresponding to a logical one value and transistor 23 coupled to a ground or reference potential 25 corresponding to a logical zero value.

Thus, when the storage node assumes a logical zero value, inverter 21 outputs a logical one value which turns on transistor 23. As a result, the storage node is maintained at a logical zero value by virtue of a signal path that couples the storage node to ground through transistors 12 and 23. When the storage node assumes a logical one value, inverter 21 outputs a logical zero value which turns on transistor 22. As a result, the storage node is maintained at a logical one value by virtue of a signal path that couples the storage node to voltage source 24.

The soft-error protection circuit 40 is coupled to storage node D0 and a read bypass circuit 30. As explained in greater detail below, the soft-error protection circuit includes an inverting circuit coupled to a keeper circuit along with other logic. The bypass circuit operates by transferring the logical value on the data line to the soft-error protection circuit along a path that bypasses inverting circuit 10 and storage circuit 20.

Figure 2:
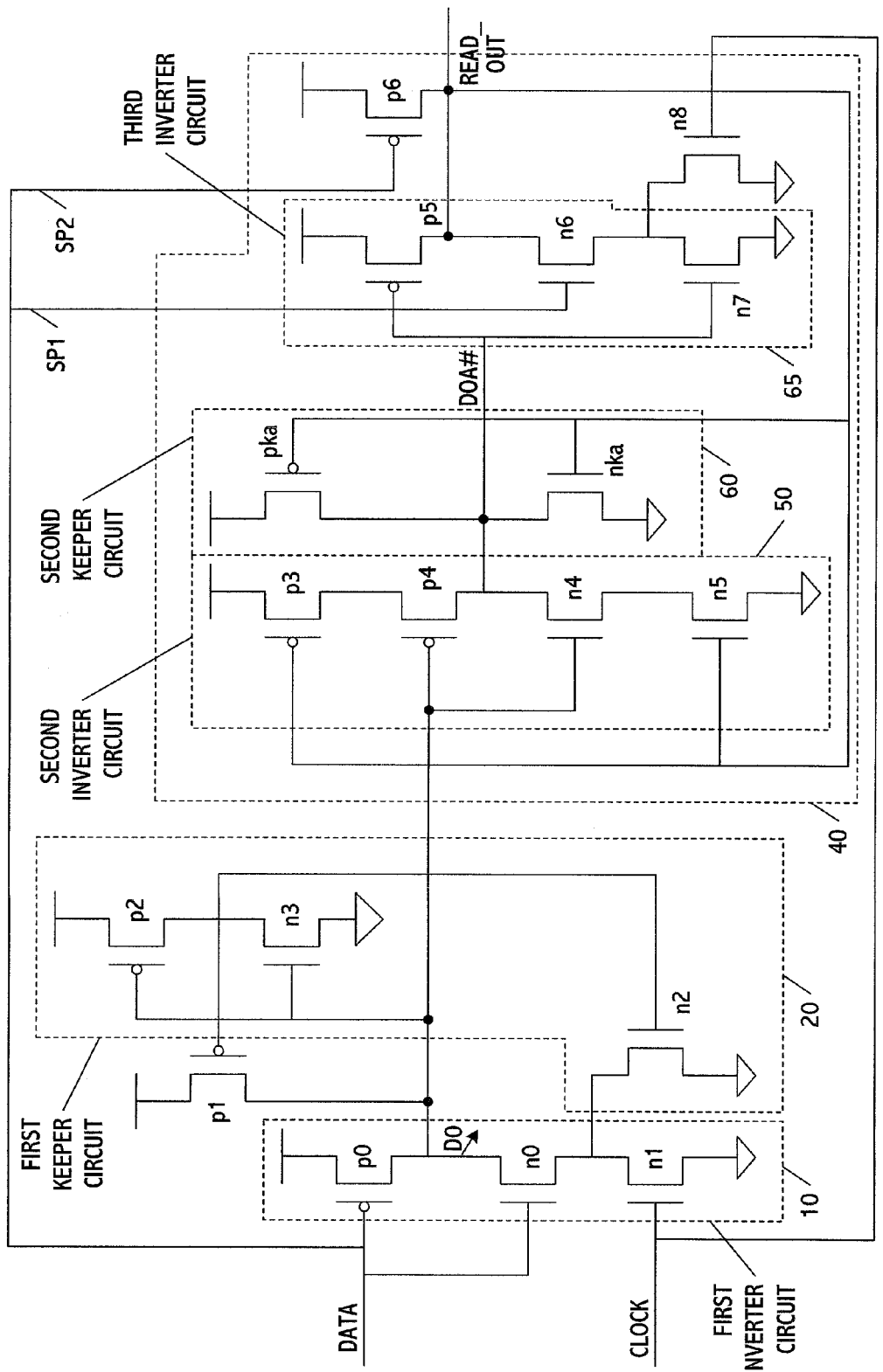
FIG. 2 is a diagram showing a more detailed implementation of the latch of FIG. 1.

FIG. 2 shows a more detailed implementation of the latch of FIG. 1 including the soft-error protection circuit. In FIG. 2, transistors p0, n0, and n1 respectively correspond to transistors 11, 12, and 13 in inverter circuit 10, and transistors p2 and n3 correspond to inverter 21, transistor p1 corresponds to transistor 22, and transistor n2 corresponds to transistor 23 in storage circuit 20.

The latch may be enhanced to include several additional features. For example, the clock signal into the inverting circuit may be used to control a transistor n8 for pulling down output node Read_Out to a logical zero value. This pulling down function may be useful in initializing or resetting the latch before a next rising edge of the clock signal, e.g., during the time between when a previous read operation was performed and when a next read operation is to be performed.

The soft-error protection circuit 40 includes a second inverting circuit 50, that compares the value stored by D0 to the Read-Out logic value, and a second storage circuit 60, e.g., a second keeper circuit. The second inverting circuit is formed from transistors p4 and n4, which are coupled between transistors p3 and n5 which are responsive to both the storage node D0 and a feedback signal from output node Read_Out to provide soft error protection. The second keeper circuit is formed from transistors pka and nka and are coupled to one another at node D0A#, which is complementary to storage node D0. The second keeper circuit prevents complementary node D0A# from floating, which may serve to further stabilize operation of the latch.

The complementary node is coupled to a third inverting circuit 65 formed from transistors p5 and n7, and the bypass circuit 30 is coupled to an intervening transistor n6 along a first signal path SP1. A second signal path SP2 of the bypass circuit is coupled to a transistor p6, which is coupled to the Read_Out node. Transistors n6 and p6 collectively form a logic gate (e.g., a NAND circuit) for helping to generate the output on output node Read_Out. Transistors n0, n1, n2, and n3 may be n-type metal-oxide-semiconductor (NMOS) devices, transistors p0, p1, and p2 may be p-type metal-oxide-semiconductor (PMOS) devices. Transistors of different conductivities may be used in alternative embodiments.

Under normal operating conditions (e.g., when no soft error exists), the first inverting circuit inverts the value on the data line and stores that value in the first keeper circuit coupled to storage node D0. The second inverting circuit compares the storage node D0 with the Read_out node, and if both have the same value, inverts the value at D0 and stores it in the second keeper circuit corresponding to complementary node D0A#. The logical value stored in the second keeper is then used to hold the output node Read_Out of the third inverting stage. If the logical values of D0 and Read_out are different, D0A# will hold its old logical value and the Read_out node will maintain its old logical value as well. Thus, when the logical values at storage node D0 and output node Read_Out match, the soft-error protection circuit allows the latch to operate normally.

The possibility of a soft-error may exist, however, when an energy particle ("e" in FIG. 1) strikes the latch, for example, at a place corresponding or coupled to storage node D0. When an event of this type occurs, the logical values at storage node D0 is temporarily modified and does not match output node Read_Out. In this case, the soft-error protection circuit will operate to cause complementary node D0A# to hold its previous (e.g., correct) value and consequently the output node Read_Out will output the correct logical value, thereby not allowing the temporarily modified state D0 to propagate to the output. Through that process, read data integrity is maintained. This may be further explained as follows.

Assume, for example, that storage node D0 stored a logical zero value and output node Read_Out was previously conditioned to logical zero during an initialization process. Both nodes Read_Out and D0 are therefore logical zero. Thus, complementary node D0A# assumes a logical one value, and transistors p2, pka, n2, and n7 are turned on to help keep the nodes D0 and Read_Out at logical zero. And, this is so even when the clock is low with transistors n1 and n8 turned off.

When a high-energy (e) particle hits storage node diffusion D0 between transistors p0 and n0, the storage node may be pulled high to a logical one value. In that case, transistor n4 is turned on but transistor n5 is still off because the Read_Out node has not changed. In this case, complementary node D0A# may therefore experience some noise, but it will stay in its state because its value is held by the second keeper circuit formed by transistors pka and nka.

Similarly, if the previous state was a logical one value, storage node D0 and output node Read_Out would reflect those same values. When a high-energy particle hits the storage node, storage node D0 may be pulled down to a logical zero value. As a result, transistor p4 would be turned on and transistor n4 would be turned off. However, because transistor p3 is still off as a result of the Read_Out node having a logical one value, complementary node D0A# would experience noise but would remain held at its previous value that was low, e.g., logical zero.

The following truth table summarizes the operation of the latch of FIG. 2:

| | Clock | Data | D0 | RDOUT | D0A# | Note |
|---|---|---|---|---|---|---|
| Precharge | Low | High | Previous D0 | Previous RDOUT | Previous D0A# | Hold previous value |
| Evaluate | High | High | Low | Low | High | Normal operation |
| | | | High | Low | High | SER |
| | | Low | High | High | Low | Normal operation |
| | | | low | High | low | SER |

In the foregoing latch, the output node Read_Out may be initialized at the same time storage node D0 is initialized. Initialization is performed by the clock signal, with the DATA line is pre-charged high, e.g., a logical one value. Initialization of the Read_Out node may take place through transistors n6, n7 and n8. During a read operation, the value of the data line is still forwarded to the Read_Out node if low, while the values at nodes D0 and D0A# are being updated.

Figure 3A:
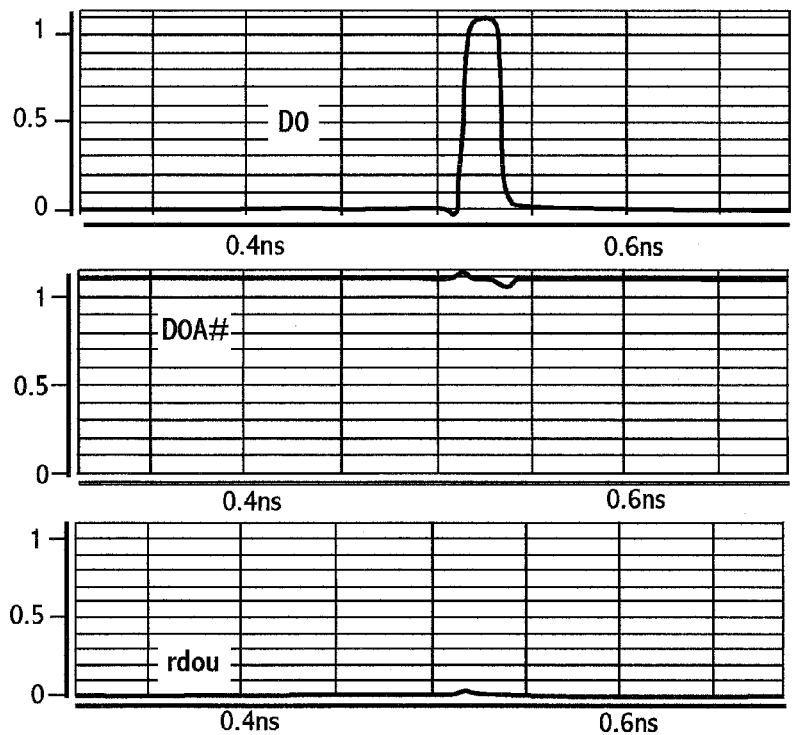
FIGS. 3a and 3b are graphs showing how soft-error protection may be performed by either of the circuits shown in FIG. 1 or 2.
Figure 3B:
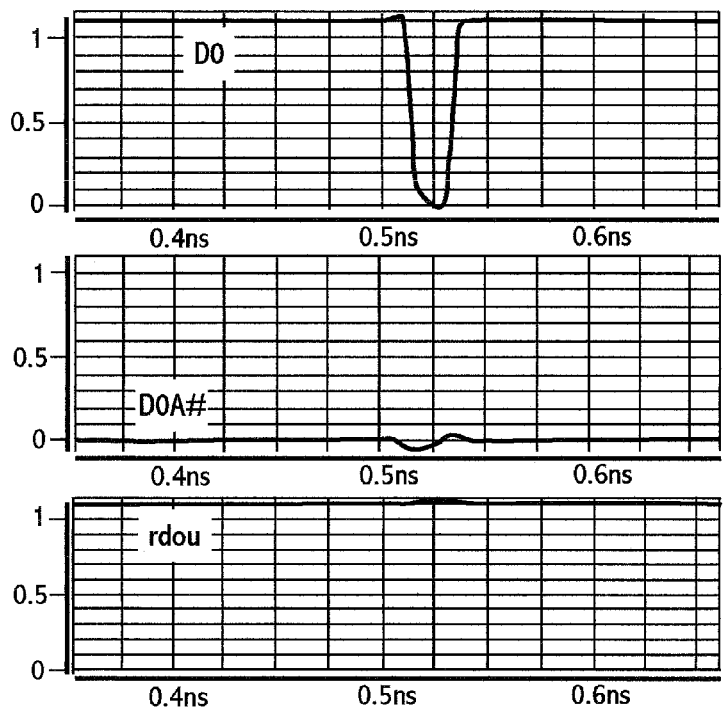

FIG. 3a shows a simulation of how a high-energy particle hitting storage node D0 would pull (e.g., charge) that node to a logical one value. This figure further shows that complementary node D0A# experiences switching noise but that output node (rdou) does not move from ground. FIG. 3b shows a simulation of how a high-energy particle hitting storage node D0 would pull (e.g., discharge) that node to a logical zero value. It can be seen in this situation as well that complementary node D0A# experiences switching noise but that the output node (Read_Out) is not affected.

Figure 4:
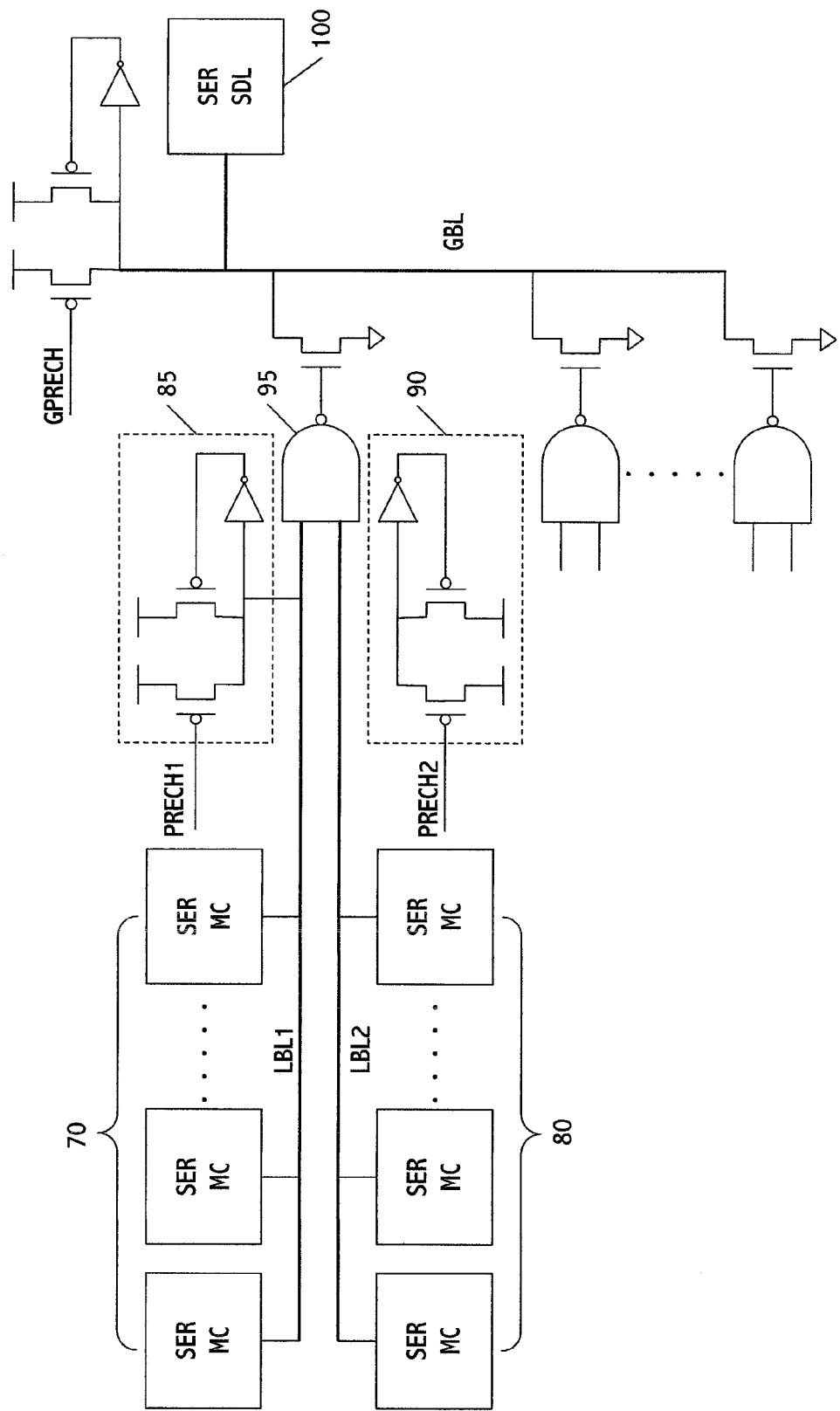
FIG. 4 is a diagram showing a memory system that includes a latch in accordance with FIG. 1 or 2.

FIG. 4 shows an example of a portion of a memory system equipped with a set dominant latch as shown in either of FIG. 1 or 2. In this figure, two sequences 70 and 80 of memory cells (MCs) are shown as being respectively coupled to local bit lines LBL1 and LBL2, and pre-charge circuits 85 and 90 are coupled to respective ones of the bit lines. The pre-charge circuits serve to pre-charge the local bit lines based on clock signals prech1 and prech2.

The two local bit lines merge into a sensing cell which, for example, may be formed by a NAND gate 95. This sensing cell is coupled to a global bit line GBL along with other sensing cells that receive data from other merged local bit lines. The GBL may be pre-charged by clock signal gprech. The data on the global bit line is latched into an SER-resilient set dominant latch 100 constructed in accordance with either of FIG. 1 or 2.

While the foregoing embodiments have been described particularly with respect to logic circuits included in a memory array, other embodiments contemplate using the soft-error protection circuit in register files, other types of latches, and flip-flops as well as other types of logic circuits are used. According to one particularly advantageous embodiment, a domino latch circuit containing a soft-error protection circuit described herein may be used to form a dynamic circuit. Moreover, in other embodiments, the storage circuit in FIG. 1 may be replaced with other types of keeper or storage circuits.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of one or more embodiments of the invention. In addition to variations and modifications in the component parts and/or arrangements, alternative uses will also be apparent to those skilled in the art.

We claim:

1. A logic circuit, comprising:
   a storage node coupled to a data line; and
   a soft-error protection circuit to change a logical value output from the storage node from a first value to a second value when the logical value of the storage node does not correspond to a logical value of an output node of the logic circuit, the logical value of the storage node to assume the first value before said change as a result of a soft-error occurring in the logic circuit, said logic circuit further comprising:
   a first inverter circuit coupled between the storage node and data line; and
   a first storage circuit coupled to an output of the first inverter circuit.

2. The circuit of claim 1, wherein the soft-error protection circuit is to change the logical value output from the storage node from the first value to the second value when the logical value of the storage node does not match the logical value of an output node of the logic circuit.

3. The circuit of claim 1, wherein the soft-error protection circuit includes:
   a second inverter circuit coupled to the storage node;
   a second storage circuit coupled to the second inverter circuit;
   wherein the output node is to send a feedback signal to the second inverter circuit to control change of the logical value of the storage node from the first value to the second value.

4. The circuit of claim 3, further comprising:
   a third inverter circuit to invert a logical value stored in the second storage circuit.

5. The circuit of claim 4, further comprising:
   a bypass circuit to couple a logical value on the data line to the output node along at least one signal path that bypasses the first inverter circuit and the first storage circuit.

6. The circuit of claim 5, wherein the bypass circuit is to couple the logical value of the data line through the third inverter circuit when the logical value is one value, and is to couple the logical value of the data line through another inverter circuit when the logical value is another value.

7. The circuit of claim 1, wherein the soft-error protection circuit is to be initialized based on the clock signal.

8. The circuit of claim 1, wherein the logic circuit is a set dominant latch.

9. The logic circuit of claim 1, further comprising:
   wherein the soft-error protection circuit includes:
   a setting circuit to set the logical value output from the storage node to the second value when the logical value of the storage node does not correspond to the logical value of the output node of the logic circuit, the setting circuit setting the logical value output from the storage node to the second value based on a feedback signal derived from the output node of the logic circuit.

10. The circuit of claim 1, wherein the setting circuit includes:
    a pull-up circuit to set the logical value output from the storage node to the second logical value when the soft-error changes the logical value of the storage node to the first value; and
    a pull-down circuit to set the logical value output from the storage node to the first logical value when the soft-error changes the logical value of the storage node to the second value.

11. The circuit of claim 1, further comprising:
    an inverter circuit coupled to the output node of the logic circuit,
    wherein the feedback signal corresponds to a logical value output from the inverter circuit.

12. The circuit of claim 11, further comprising:
    a first feed-forward path to carry a logical value of the data line to control the inverter circuit; and
    a second feed-forward path to carry the logical value of the data line to a control circuit coupled to an output node of the inverter circuit, wherein the control circuit is to control the output node of the inverter circuit based on the logical value carried on the second feed-forward path, and wherein the logical value carried on the second feed-forward path is to control the control circuit and the logical value carried on the first feed-forward path is to control the inverter circuit based on different logical values of the data line.

13. The circuit of claim 12, wherein the first feed-forward path is coupled to the second feed-forward path.

14. The logic circuit of claim 1, wherein the soft-error occurs as a result of an e particle striking the storage node.

15. A memory, comprising:
    a plurality of local bit lines;
    a plurality of memory cells coupled to the local bit lines;
    a sensing circuit coupled to at least two of the local bit lines;
    a global bit line coupled to an output of the sensing circuit; and
    a logic circuit coupled to the global bit line, the logic circuit including:
    a storage node coupled to a data line; and
    a soft-error protection circuit to change a logical value output from the storage node from a first value to a second value when the logical value of the storage node does not correspond to a logical value of an output node of the logic circuit, the logical value of the storage node to assume the first value before said change as a result of a soft-error occurring in the logic circuit, wherein the soft-error protection circuit includes:
    a setting circuit to set the logical value output from the storage node to the second value when the logical value of the storage node does not correspond to the logical value of the output node of the logic circuit, the setting circuit setting the logical value output from the storage node to the second value based on a feedback signal derived from the output node of the logic circuit, said logic circuit further comprising:
first inverter circuit coupled between the storage node and data line; and
a first storage circuit coupled to an output of the first inverter circuit.

16. The memory of claim 15, wherein the soft-error protection circuit is to change the logical value output from the storage node from the first value to the second value when the logical value of the storage node does not match the logical value of an output node of the logic circuit.

17. A memory, comprising:
a plurality of local bit lines;
a plurality of memory cells coupled to the local bit lines;
a sensing circuit coupled to at least two of the local bit lines;
a global bit line coupled to an output of the sensing circuit; and
a logic circuit coupled to the global bit line, the logic circuit including:
a storage node coupled to a data line; and
a soft-error protection circuit to change a logical value of the storage node from a first value to a second value when the logical value of the storage node does not correspond to a logical value of an output node of the logic circuit, the logical value of the storage node to assume the first value before said change as a result of a soft-error occurring in the logic circuit, the logic circuit further comprising:
a first inverter circuit coupled between the storage node and data line; and
a first storage circuit coupled to an output of the first inverter circuit.

18. The memory of claim 17, wherein the soft-error protection circuit includes:
a second inverter circuit coupled to the storage node;
a second storage circuit coupled to the second inverter circuit;
wherein the output node is to send a feedback signal to the second inverter circuit to control change of the logical value of the storage node from the first value to the second value.

19. The memory of claim 18, further comprising:
a third inverter circuit to invert a logical value stored in the second storage circuit.

20. The memory of claim 19, further comprising:
a bypass circuit to couple a logical value on the data line to the output node along at least one signal path that bypasses the first inverter circuit and the first storage circuit.

21. A soft-error protection method for a logic circuit, comprising:
changing a logical value output from a storage node from a first value to a second value when the logical value of the storage node does not correspond to a logical value of an output node of a logic circuit, the logical value of the storage node to assume the first value before said change as a result of a soft-error occurring in the logic circuit, wherein said changing includes:
setting the logical value output from the storage node to the second value when the logical value of the storage node does not correspond to the logical value of the output node of the logic circuit, the logical value output from the storage node set to the second value based on a feedback signal derived from the output node of the logic circuit, said method further comprising:
inverting the logical value output from the output node of the logic circuit, wherein the feedback signal corresponds to a logical value output from an inverter circuit which performs said inverting,
carrying a logical value of the data line along a first feed-forward path to control inversion of the logical value output from the output node of the logic circuit; and
carrying the logical value of the data line along a second feed-forward path to a control circuit coupled to an output node of the inverter circuit, wherein the control circuit is to control the output node of the inverter circuit based on the logical value carried on the second feed-forward path, and wherein the logical value carried on the second feed-forward path is to control the control circuit and the logical value carried on the first feed-forward path is to control the inverter circuit based on different logical values of the data line.

22. The method of claim 21, wherein said setting includes:
setting the logical value output from the storage node to the second logical value when the soft-error changes the logical value of the storage node to the first value; and
setting the logical value output from the storage node to the first logical value when the soft-error changes the logical value of the storage node to the second value.

23. The method of claim 21, wherein the first feed-forward path is coupled to the second feed-forward path.

* * * * *